(12) United States Patent
Yang et al.

(10) Patent No.: US 7,420,872 B2
(45) Date of Patent: Sep. 2, 2008

(54) COMMAND DECODER CIRCUIT OF SEMICONDUCTOR MEMORY DEVICE

(75) Inventors: Sun Suk Yang, Kyoungki-do (KR); Jung Hoon Park, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 95 days.

(21) Appl. No.: 11/647,761

(22) Filed: Dec. 29, 2006

(65) Prior Publication Data

US 2007/0183249 A1 Aug. 9, 2007

(30) Foreign Application Priority Data

Jan. 13, 2006 (KR) .................. 10-2006-0003974

(51) Int. Cl.
*G11C 8/00* (2006.01)

(52) U.S. Cl. .................. 365/233.1; 365/230.06

(58) Field of Classification Search ............... 365/233.1, 365/230.06, 189.04

See application file for complete search history.

(56) References Cited

U.S. PATENT DOCUMENTS

| | | | | |
|---|---|---|---|---|
| 5,673,233 A * | 9/1997 | Wright et al. | .......... | 365/233.14 |
| 6,483,769 B2 * | 11/2002 | La | .............. | 365/194 |
| 6,714,438 B2 | 3/2004 | Kawabata | | |
| 6,757,214 B2 * | 6/2004 | Kawaguchi et al. | ...... | 365/233.1 |
| 7,027,337 B2 * | 4/2006 | Johnson et al. | ............. | 365/194 |
| 2005/0141333 A1 | 6/2005 | Fujisawa | | |

FOREIGN PATENT DOCUMENTS

| | | |
|---|---|---|
| KR | 19990014268 | 2/1999 |
| KR | 1020060054575 | 5/2006 |

* cited by examiner

*Primary Examiner*—Anh Phung
(74) *Attorney, Agent, or Firm*—Ladas & Parry LLP

(57) ABSTRACT

A command decoder circuit generates command signals for performing internal operations and according to external command signals, according to values of the write latency values and whether write latency is an even numbered or odd-numbered value.

19 Claims, 4 Drawing Sheets

COMMAND DECODER CIRCUIT OF SEMICONDUCTOR MEMORY DEVICE

FIELD OF THE INVENTION

The present invention relates to a semiconductor memory device and more particularly to a command decoder circuit generating command signals for performing internal operations according to external commands.

DESCRIPTION OF THE PRIOR ART

In a write operation, a DDR SDRAM generates a write command signal Caspwt6 for the write operation through a command decoder circuit illustrated in FIG. 1. This will be described with reference to FIG. 2.

First, a clock buffer unit 10 receives and buffers an external clock signal CLK to output a single internal clock pulse signal Clkp that is synchronized with the rising edge of the external clock signal CLK. A command buffer unit 20 buffers an external command signal CMD to output an internal command signal ndA/ndAz corresponding to a write command WT.

A latch unit 30 allows the internal command signal ndA/ndAz to be synchronized with the rising edge of the internal clock buffer signal Clkp, latches the internal clock pulse signal Clkp at the time point at which the internal clock pulse signal Clkp is synchronized with the internal command signal ndA/ndAz, and then outputs a CAS pulse signal Casp. The internal command signal ndA/ndAz is synchronized with the rising edge of the internal clock pulse signal Clkp so that hold time and setup time are adjusted.

A clock shift unit 40 shifts the CAS pulse signal Casp by a write latency WL to output the write command signal Caspwt6. Since the write latency WL has a value of 1, the CAS pulse signal Casp is shifted three times in the rising edge or the falling edge of the internal clock pulse signal Clkp, and is output as the write command signal Caspwt6.

As described above, the command decoder circuit of the semiconductor memory device according to the prior art generates the write command signal Caspwt6 by using the internal clock pulse signal Clkp, in which the external clock signal CLK has been buffered, when the write command WT is input. Since the period of the external clock signal CLK is reduced when the memory device operates at high speed, the command decoder circuit of the semiconductor memory device according to the prior art may not output the write command signal Caspwt6 at a proper time point during high speed operation.

For example, when the command decoder circuit operates with a frequency of 1 GHz, it is assumed that a DDR SDRAM operates after receiving an external clock signal CLK with the pulse width of a high level of 500 ps and the pulse width of a low level of 500 ps.

If for example, a DDR SDRAM operates by receiving an external 1 GHz clock signal CLK having a 500 ps high level pulse width and a 500 ps low level pulse width, it had to shift a command during the 500 ps high level section of the external clock signal CLK and latch the shifted command during the 500 ps low level section of the external clock signal CLK to perform write operation normally. Because of clock shift unit 40, limitations, the time required for shifting and latching a command may need to be greater than 500 ps. Therefore, when data is processed using the command decoder according to the prior art, if a failure occurs or the CAS pulse signal Casp is not shifted at a desired time, the CAS pulse signal Casp may be shifted at the rising edge or the falling edge of a subsequent clock signal.

In other words, when a memory device operates at high speed, the period of the internal clock pulse signal Clkp synchronized with the rising edge of the external clock signal CLK is reduced since the period of the external clock signal CLK is reduced.

Since the command decoder circuit of a prior art semiconductor memory device shifts the CAS pulse signal Casp to output the write command signal Caspwt6, it may not be possible to sufficiently ensure the pulse width of the internal clock pulse signal Clkp. Therefore, when data is processed, failure may occur, or the write command signal Caspwt6 may be output after being delayed longer than the predetermined write latency WL.

SUMMARY OF THE INVENTION

Accordingly, the present invention has been made to solve the above-mentioned problems occurring in the prior art. An object of the present invention is to reduce memory operation failure and process data at a desired time point by sufficiently ensuring the pulse width of an internal clock pulse signal when a memory device operates at high speed.

In order to overcome limitations of the prior art and achieve at least the above-identified object, according to one aspect of the present invention, there is provided a command decoder circuit of a semiconductor memory device. The command decoder circuit includes a clock division/buffer unit that divides an external clock signal, and which buffers the divided signal to output two, separate first and second internal clock pulse signals. A selector circuit selects one of the first and second internal clock pulse signals based on values of a write latency. A command pass circuit temporally shifts an external command signal to the extent of the write latency value by using an output signal of the selector, thereby outputting a write command signal for performing a write operation.

It is preferred that the clock division/buffer circuit or unit divides the external clock signal into halves in order to output first and second internal clock pulse signals having a pulse width twice as wide as the external clock signal, so that the first internal clock pulse signal has a phase that is substantially the inverse of the second internal clock pulse signal.

The clock division/buffer circuit may include: a first flip-flop for dividing the external clock signal into halves at a predetermined edge of the external clock signal; a first inverter chain for buffering an output signal of the first flip-flop to output the first internal clock pulse signal; a second flip-flop for inverting the first internal clock pulse signal at the predetermined edge of the external clock signal; and a second inverter chain for buffering an output signal of the second flip-flop to output the second internal clock pulse signal.

The first flip-flop may include a D flip-flop which receives the external clock signal through a clock terminal, receives a signal, which is outputted from an inversion output terminal, and then, through an input terminal, outputs an output signal through an output terminal. The second flip-flop may include a D flip-flop which receives the external clock signal through a clock terminal, receives the first internal clock pulse signal through an input terminal, and then outputs an output signal through an inversion output terminal.

The selector may include: a first selection circuit for determining whether to output the first internal clock pulse signal according to the values of the write latency; and a second selection circuit for determining whether to output the second internal clock pulse signal according to the values of the write latency. Each of the first and the second selection circuit may include a tri-state inverter performing an operation controlled according to the values of the write latency.

The selector may include: first combination means for NAND-combining the first internal clock pulse signal with a signal obtained by inverting a write latency signal having a logic level determined according to the values of the write latency; second combination means for NAND-combining the write latency signal with the second internal clock pulse signal; and third combination means for NAND-combining an output signal of the first combination means with an output signal of the second combination means.

The selector may output the second internal clock pulse signal when the write latency is an even number value, and output the first internal clock pulse signal when the write latency is an odd number value.

The command pass unit may include: a command buffer unit for buffering the external command signal to output an internal command signal corresponding to a write command; a latch unit for allowing the internal command signal to be synchronized with the output signal of the selector, and latching the synchronized output signal of the selector, thereby outputting a write pulse signal; and a clock shift unit for shifting the write pulse signal to the extent of the write latency by using the output signal of the selector, thereby outputting the write command signal.

It is preferred that the latch unit allows the internal command signal to be synchronized with a rising edge of the output signal of the selector.

In order to achieve the above object, according to another aspect of the present invention, there is provided a command decoder circuit of a semiconductor memory device, the command decoder circuit including: clock generation circuit or unit that generates an internal clock pulse signal obtained by dividing an external clock signal into at least halves, and outputting a first internal clock pulse signal synchronized with a rising edge of the internal clock pulse signal, or outputting a second internal clock pulse signal synchronized with a falling edge of the internal clock pulse signal, the external clock signal having a period changing according to operation speeds of the memory device; and a command pass unit for shifting an external command signal by a write latency by using the first or second internal clock pulse signal provided by the clock generation means, thereby outputting a write command signal for performing a write operation.

The clock generation circuit or unit can include: a clock division/buffer unit that generates a first divided internal clock pulse signal synchronized with a rising edge of the external clock signal, and the second divided internal clock pulse signal, synchronized with a falling edge of the external clock signal; and a selector circuit that selects one of the first internal clock pulse signal and the second internal clock pulse signal outputted from the clock division/buffer according to values of a write latency.

The clock division/buffer circuit can include: a first division circuit that generates a first divided internal clock pulse signal synchronized with the rising edge of the external clock signal; a second division circuit that generates a second divided internal clock pulse signal synchronized with the falling edge of the external clock signal; and an output circuit that outputs a first internal clock pulse signal generated by the first division circuit and the second internal clock pulse signal generated by the second division circuit.

The first division circuit can include a flip-flop, which uses the external clock signal as a clock signal, and which has an inversion output terminal connected to an input terminal, thereby dividing the external clock signal into halves to output the first internal clock pulse signal.

The second division circuit inverts the first internal clock pulse signal of the first division circuit by using the external clock signal as a clock signal, thereby outputting the second internal clock pulse signal. The second division circuit may include a D flip-flop for receiving the external clock signal through a clock terminal, receiving the first internal clock pulse signal through an input terminal, and outputting the second internal clock pulse signal through an inversion output terminal.

The selector can include: a first selection circuit that determines whether to output the first internal clock pulse signal according to the values of the write latency; and a second selection circuit for determining whether to output the second internal clock pulse signal according to the values of the write latency. It is preferred that the second selection circuit outputs the second internal clock pulse signal when the write latency is an even number value, and the first selection circuit outputs the first internal clock pulse signal when the write latency is an odd number value.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 3:
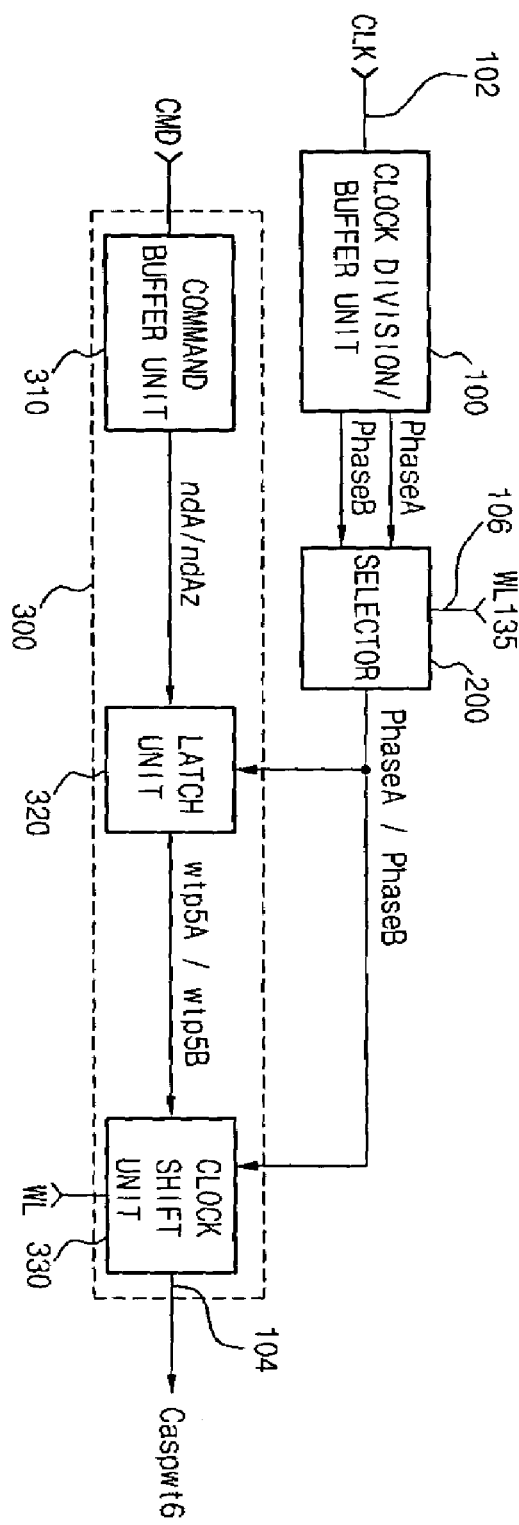
FIG. 3 is a block diagram illustrating an embodiment of a command decoder circuit of a semiconductor memory device.

FIG. 3 shows an embodiment of the command decoder circuit according to the present invention. In FIG. 3, an external clock signal CLK is received at an input clock terminal 102 and divided by the clock division buffer unit 100 to generate two internal clock pulse signals identified in FIG. 3 as Phase A and Phase B with sufficient pulse widths. A write command signal Caspwt6 for a write operation is output from an output terminal 104 using one of the internal clock pulse signals Phase A or Phase B, with the particular clock pulse signals Phase A or Phase B being selected by the write latency signal WL 135 that is input to an input terminal 106.

In greater detail, the circuit shown in FIG. 3 includes a clock division/buffer circuit or unit 100, a selector 200 and a command pass unit 300. The clock division/buffer circuit 100 divides the external clock signal CLK and buffers the divided signals to output the internal clock pulse signals Phase A and Phase B.

The selector circuit 200 selects one of the internal clock pulse signals Phase A and Phase B according to a write latency signal WL135. More particularly, Phase A or Phase B is selected by the selector circuit 200 using the value of the write latency WL.

The command pass circuit 300 shifts an external command signal CMD to the extent of the write latency WL by using the output signal Phase A or Phase B of the selector 200. The command pass circuit 300 thereby outputs a write command signal Caspwt6 for performing a write operation.

The command pass unit 300 includes a command buffer unit 310, a latch unit 320 and a clock shift unit 330.

The command buffer unit 310 buffers the external command signal CMD to output an internal command signal ndA/ndAz corresponding to a write command WT. The latch unit 320 allows the internal command signal ndA/ndAz to be synchronized with the output signal, either Phase A or Phase B of the selector 200, and latches the synchronized output signal Phase A or Phase B of the selector 200, thereby outputting a write pulse signal wtp5A or wtp5B. The write pulse signal wtp5A is generated by the internal clock pulse signal Phase A. The write pulse signal wtp5B is generated by the internal clock pulse signal Phase B.

The clock shift unit 330 temporally shifts the write pulse signal wtp5A or wtp5B to the extent of the write latency WL by using the output signal Phase A or Phase B of the selector 200, thereby outputting the write command signal Caspwt6.

Figure 4:
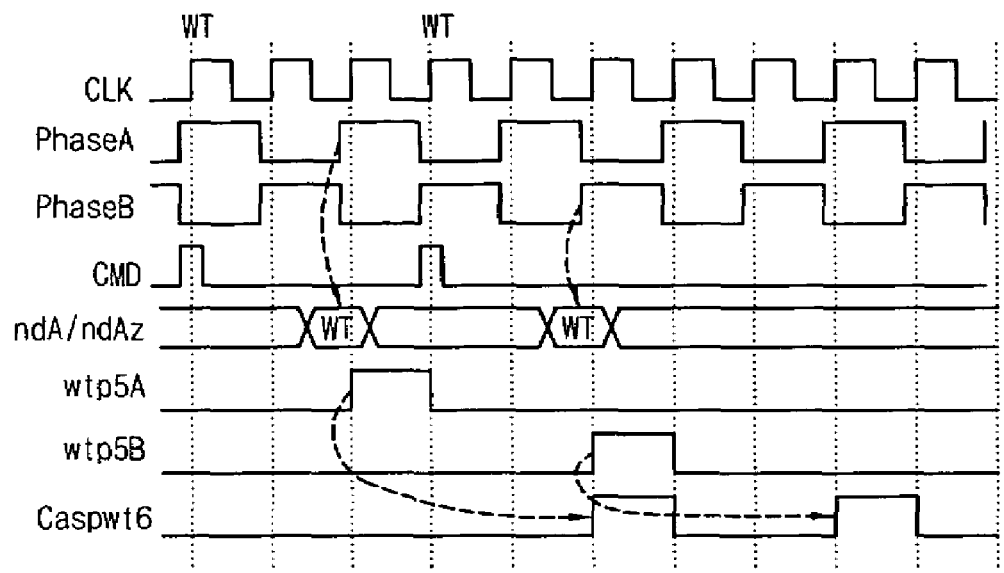
FIG. 4 is a timing diagram illustrating an operation of the command decoder circuit in FIG. 3 when a write latency has a value of 1 in 4-bit prepatch operation.

The operation of the embodiment of the present invention including such a construction will be described with reference to FIG. 4.

First, the clock division/buffer unit 100 divides the external clock signal CLK, and buffers the divided signals to output the internal clock pulse signals Phase A and Phase B. It is preferred that the frequency of each of the internal clock pulse signals Phase A and Phase B is half the frequency of the clock signal CLK, and so that each of them has a pulse width or period that is substantially equal to double or twice as wide as the pulse width or period of the external clock signal CLK. In addition, the phase of the internal clock pulse signal Phase B is opposite to, i.e., the inverse of, the phase of the internal clock pulse signal Phase A.

Figure 5:
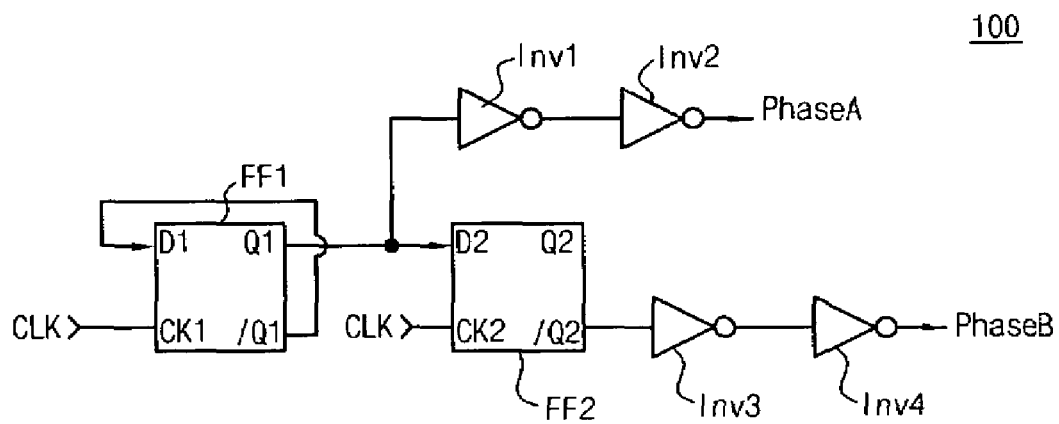
FIG. 5 is a circuit diagram illustrating one embodiment of the clock division/buffer unit 210 in FIG. 3.

In one embodiment, the clock division/buffer unit 100 can include one or more latches, counters and flip-flop circuits, which can divide the external clock signal CLK, and may preferably have the construction as illustrated in FIG. 5. That is, the clock division/buffer unit 100 can include D flip-flops FF1 and FF2, (both of which receive the CLK signal), and inverters Inv1 to Inv4 as illustrated in FIG. 5. The series-connected inverters Inv1 and Inv2 and the series-connected inverters Inc3 and Inv4 can be considered to be inverter chains. Each inverter chain has an input and an output. PhaseA is output from the first inverter chain Inv1 and Inv2 and PhaseB is output from the second inverter chain Inv3 and Inv4.

The D flip-flop FF1 receives the external clock signal CLK through the flip-flop's clock input terminal CK1. The D flip-flop FF1 also receives at its D input, the signal output from its invertedoutput terminal /Q1, (pronounced: Q-bar one). Two inverters, i.e., Inv1 and Inv2, buffer the signal output from theoutput terminal Q1 of the D flip-flop FF1, thereby outputting the internal clock pulse signal Phase A.

The D flip-flop FF2 receives the external clock signal CLK through the D flip-flop's clock input terminal CK2. D flip-flop FF2 receives at its D-input, the signal, output from the Q1 output terminal of the first D flip-flop FF1. Two inverters, i.e., Inv3 and Inv4, buffer the signal output from the output terminal /Q2 of the D flip-flop FF2, thereby outputting the internal clock pulse signal Phase B.

As described above, the clock division/buffer unit 100 divides the external clock signal CLK into halves through the D flip-flop FF1, and buffers the output signal of the D flip-flop FF1, thereby outputting the internal clock pulse signal Phase A. The clock division/buffer unit 100 outputs the internal clock pulse signal Phase B through the D flip-flop FF2 and the two inverters Inv3 and Inv4, so that the internal clock pulse signal Phase B can have a phase that is inverse to that of the phase of the internal clock pulse signal Phase A.

The selector 200 shown in FIG. 3 outputs the internal clock pulse signal Phase A when the write latency WL is an odd number value, and outputs the internal clock pulse signal Phase B when the write latency WL is an even number value.

Figure 6A:
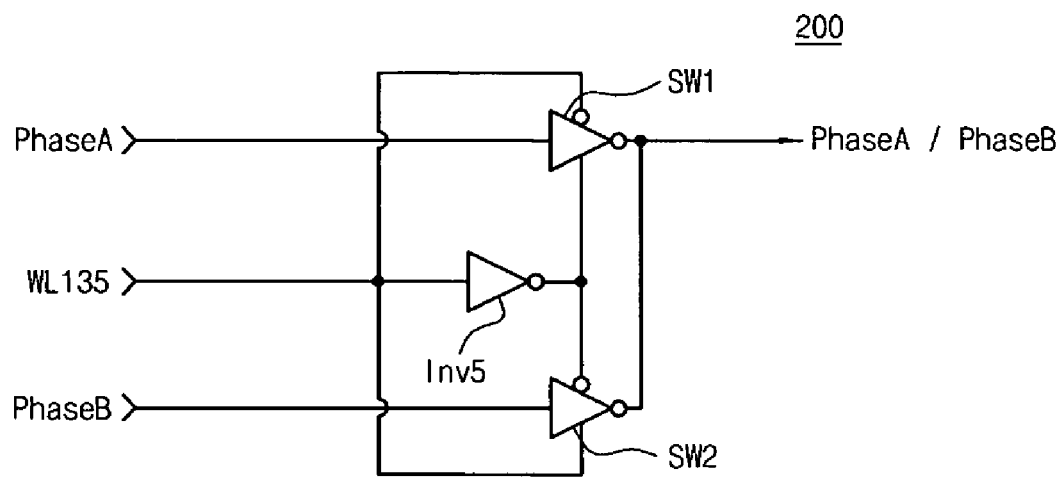
FIG. 6a is a circuit diagram illustrating one embodiment of the selector 240 in FIG. 3.
Figure 6B:
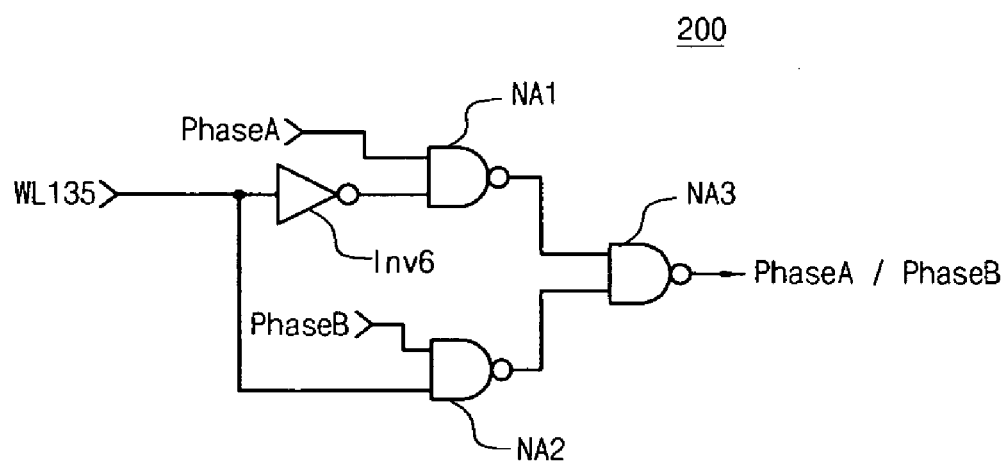
FIG. 6b is a circuit diagram illustrating another embodiment of the selector 240 in FIG. 3.

The selector 200 may include various circuits for selectively outputting one of the internal clock pulse signals Phase A and Phase B according to the write latency signal WL135. FIGS. 6A and 6B depict two equivalent embodiments of a selector circuit 200.

As illustrated in FIG. 6a, the selector 200 may include an inverter Inv5 that inverts the write latency signal WL135. The selector 200 also includes a first switching device SW1 and a second switching device SW2. The first switching device SW1 determines whether to output the internal clock pulse signal Phase A according to the logic level of the write latency signal WL135. The second switching device SW2 also determines whether to output the internal clock pulse signal Phase B according to the logic levels of the write latency signal WL135.

The first and second switching devices SW1 and SW2 can be implemented using tri-state inverters.

As illustrated in FIG. 6b, the selector 200 may include an inverter Inv6 for inverting the write latency signal WL135, a first NAND gate NA1, a second NAND gate NA2, and a third NAND gate NA3. The first NAND gate NA1 logically combines a signal inverted by the inverter Inv6 with the internal clock pulse signal Phase A. The second NAND gate NA2 logically combines the write latency signal WL135 with the internal clock pulse signal Phase B. The third NAND gate NA3 logically combines the output signal of the first NAND gate NA1 with the output signal of the second NAND gate NA2.

Using NAND (or NAND-equivalent) circuits as shown in FIGS. 6a and 6b, the selector circuit 200 selects one of the internal clock pulse signals Phase A and Phase B according to the logic levels of the write latency signal WL135, and transfers the selected signal to the latch unit 320 and the clock shift unit 330.

When the write latency value is an even number, the write latency signal WL135 is a high level signal. When the write latency value is an odd number, the write latency signal WL135 is a low level signal.

Accordingly, when the write latency signal WL135 is at a low level, the selector 200 outputs the internal clock pulse signal Phase A. When the write latency signal WL135 is at a high level, the selector 200 outputs the internal clock pulse signal Phase B.

Referring to FIG. 3, the command buffer circuit or "unit" 310 buffers the external command signal CMD to output the internal command signal ndA/ndAz, which corresponds to the write command WT. When the write enable signal WE of the external command signal CMD is at a high level, the command buffer unit 310 outputs the internal command signal ndA/ndAz corresponding to the write command WT.

The latch unit 320 allows the internal command signal ndA/ndAz to be synchronized with the internal clock pulse signal Phase A or the internal clock pulse signal Phase B. Herein, the internal command signal ndA/ndAz is synchronized with the rising edge of the internal clock pulse signal Phase A or the internal clock pulse signal Phase B so that hold time and setup time are adjusted. Latch unit 320 latches the synchronized internal clock pulse signal Phase A or Phase B, thereby outputting write pulse signals wtp5AB.

When the selector 200 selects the internal clock pulse signal Phase A, the clock shift unit 330 shifts the write pulse signal wtp5A to the extent of the write latency WL at a predetermined edge of the internal clock pulse signal Phase A. When the selector 200 selects the internal clock pulse signal Phase B, the clock shift unit 330 shifts the write pulse signal wtp5B by the write latency WL at a predetermined edge of the internal clock pulse signal Phase B.

As described above, when the write latency has a value of 1, the command decoder circuit of the semiconductor memory device according to the present invention shifts the write pulse signal wtp5A or wtp5B to the extent of the write latency WL at a predetermined edge of the internal clock pulse signal Phase A or Phase B through the clock shift unit 330. In other words, when the write latency has a value of 1, the clock shift unit 300 shifts the write pulse signal wtp5A one and a half (1.5) time at the predetermined edge of the internal clock pulse signal Phase A, thereby outputting the write command signal Caspwt6. Then, the semiconductor memory device performs a write operation when data is inputted to each memory cell according to the write command signal Caspwt6. That is, the data is inputted to each memory cell when the write command signal Caspwt6 is at a high level.

As described above, when the write command is input, the command decoder circuit of the semiconductor memory device according to the embodiment of the present invention outputs the write command signal Caspwt6 by using the internal clock pulse signals Phase A and Phase B into which the external clock signal CLK has been divided.

Accordingly, even when the pulse width of the external clock signal CLK is reduced in a high speed operation of the memory device, the command decoder circuit of the semiconductor memory device according to the embodiment of the present invention generates the internal clock pulse signal Phase A or Phase B having a pulse width at least twice as wide as the external clock signal CLK, so that it is possible to stably perform a write operation.

In other words, the command decoder circuit of the semiconductor memory device according to the embodiment of the present invention shifts the write pulse signals wtp5A by using the internal clock pulse signals Phase A and Phase B in the write operation.

Herein, the command decoder circuit of the semiconductor memory device according to the embodiment of the present invention uses the internal clock pulse signal Phase A or Phase B having a sufficient pulse width in the high speed operation, so that it is possible to reduce a problem in which failure occurs in processing data, or the write command signal Caspwt6 is outputted after being delayed longer than the predetermined write latency WL.

Further, in the write operation, the command decoder circuit of the semiconductor memory device according to the embodiment of the embodiment of the present invention can reduce the number of shifts when shifting the write pulse signals wtp5A by using the internal clock pulse signals Phase A and Phase B, as compared to the prior art.

Figure 1:
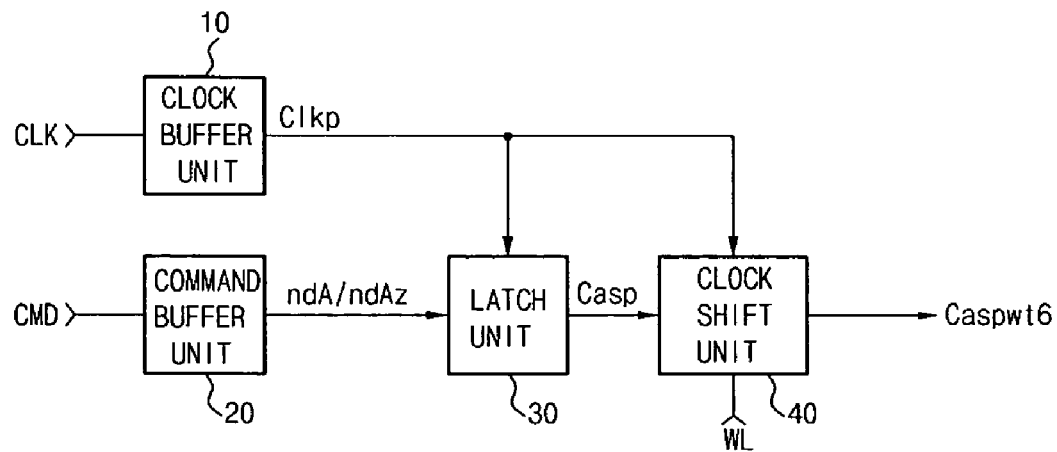
FIG. 1 is a block diagram illustrating a command decoder circuit of a semiconductor memory device according to the prior art.
Figure 2:
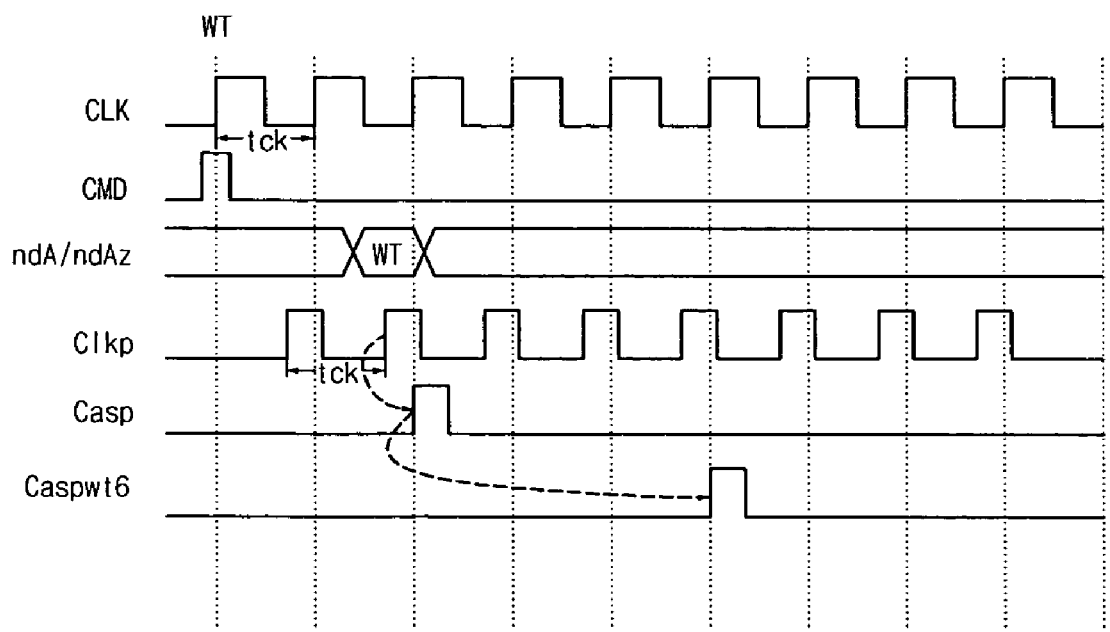
FIG. 2 is a timing diagram illustrating an operation of the command decoder circuit in FIG. 1 when a write latency has a value of 1 in 4-bit prepatch operation.

Each of the internal clock pulse signals Phase A and Phase B in the command decoder circuit of the semiconductor memory device according to the embodiment of the present invention, has a pulse width wider than that of the internal clock pulse signal CLKp in the command decoder circuit of FIGS. 1 and 2. When the write latency has a value of 1, a clock shift occurs three times on the basis of the internal clock pulse signal Clkp in the command decoder circuit of FIGS. 1 and 2. However, in the command decoder circuit of the semiconductor memory device according to the embodiment of the present invention, a clock shift occurs 1.5 times on the basis of the internal clock pulse signal Phase A.

On account of differences in the pulse width, when the write latency has a value of 2, a clock shift occurs four times on the basis of the internal clock pulse signal Clkp in the command decoder circuit of FIGS. 1 and 2. However, in the command decoder circuit of the semiconductor memory device according to the embodiment of the present invention, a clock shift occurs twice on the basis of the internal clock pulse signal Phase B. Accordingly, the command decoder circuit of the semiconductor memory device according to the embodiment of the present invention can reduce the number of clock shifts as compared to the prior art, so that a high speed operation and cost reduction can be achieved.

In other words, the command decoder circuit for a semiconductor memory device according to the present invention can reduce the number of clock shifts as compared to the prior art methods so that it is possible to reduce the number of elements constituting the clock shift unit, which is advantageous in terms of high speed operation and cost reduction. As described above, the present invention generates an internal clock pulse signal having a sufficient pulse width, which is advantageous in terms of stable high speed operation and cost reduction.

While the preferred embodiments are shown and described as being implemented with combinational logic gates and latches, those of ordinary skill in the art will recognize that the preferred embodiments described above could also be implemented using other devices. For example, one or more appropriately fast processors and/or field programmable gate array or FPGA might be used to implement the command decoder circuit, provided of course that they are fast enough to operate at the relevant speeds. Such other devices are therefore considered to be structures equivalent to combinational and sequential logic devices depicted in the figures and described in the foregoing text.

The preferred embodiment of the present invention has been described for illustrative purposes. Those skilled in the art will appreciate that various modifications, additions and substitutions are possible, without departing from the scope and spirit of the invention as disclosed in the accompanying claims.

What is claimed is:

1. A command decoder circuit for a semiconductor memory device, the command decoder circuit comprising:
    a clock division/buffer circuit that receives an external clock signal, and which buffers and divides the external clock signal to produce first and second internal clock pulse signals;
    a selector, that receives a write latency signal, the first and second internal clock signals, and which outputs one of the first and second internal clock pulse signals according to a value of the write latency signal; and
    a command pass unit that shifts an external command signal according to the write latency value by using an output signal of the selector, thereby outputting a write command signal for performing a write operation.

2. The command decoder circuit as claimed in claim 1, wherein the clock division/buffer circuit includes circuits that divide the external clock signal into halves, each of the signal halves having a phase and corresponding to the first and second internal clock pulse signals, each half having a pulse width substantially equal to twice the width of the external clock signal, and wherein the phase of first internal clock pulse signal is substantially inverse to that of the phase of the second internal clock pulse signal.

3. The command decoder circuit as claimed in claim 2, wherein the clock division/buffer circuit comprises:
    a first flip-flop for dividing the external clock signal at a predetermined edge of the external clock signal;

a first inverter chain for buffering an output signal of the first flip-flop and to output the first internal clock pulse signal;

a second flip-flop for inverting the first internal clock pulse signal at the predetermined edge of the external clock signal; and a second inverter chain for buffering an output signal of the second flip-flop and to output the second internal clock pulse signal.

4. The command decoder circuit as claimed in claim 3, wherein the first flip-flop includes a D flip-flop having a clock input, a D input, a Q output and a /Q output, wherein the D-flip flop receives the external clock signal through the clock input terminal, receives a signal output from the flip-flop's /Q output at the D-input input terminal, and which outputs first internal clock pulse signal from the Q output terminal.

5. The command decoder circuit as claimed in claim 3, wherein the second flip-flop includes a D flip-flop having a clock input terminal, a D input terminal, a Q output and a /Q output, the D flip flop receiving the external clock signal through the flip-flop's clock input terminal, receives the first internal clock pulse signal through its D input terminal, and then outputs a second internal clock signal through the flip-flop's /Q output terminal.

6. The command decoder circuit as claimed in claim 1, wherein the selector comprises:

a first selection circuit for determining whether to output the first internal clock pulse signal according to write latency values; and a second selection circuit for determining whether to output the second internal clock pulse signal according to a write latency value.

7. The command decoder circuit as claimed in claim 6, wherein each of the first selection circuit and the second selection circuit includes a tri-state inverter that performs an operation controlled according to a value of the write latency.

8. The command decoder circuit as claimed in claim 1, wherein the selector comprises:

a first NAND gate, combining the first internal clock pulse signal with a signal obtained by inverting a write latency signal having a logic level determined according to a value of the write latency;

a second NAND gate combining the write latency signal with the second internal clock pulse signal; and a third NAND gate, combining an output signal of the first combination means with an output signal of the second combination means.

9. The command decoder circuit as claimed in claim 6 or 8, wherein the selector outputs the second internal clock pulse signal when the write latency value is an even number, and outputs the first internal clock pulse signal when the write latency value is an odd number.

10. The command decoder circuit as claimed in claim 1, wherein the command pass unit comprises:

a command buffer circuit that buffers the external command signal to output an internal command signal corresponding to a write command;

a latch circuit that synchronizes the internal command signal with the output signal of the selector, and which latches the synchronized output signal of the selector, thereby outputting a write pulse signal; and a clock shift circuit that shifts the write pulse signal according to the write latency by using the output signal of the selector, thereby outputting the write command signal.

11. The command decoder circuit as claimed in claim 10, wherein the latch circuit allows the internal command signal to be synchronized with a rising edge of the output signal of the selector.

12. A command decoder circuit of a semiconductor memory device, the command decoder circuit comprising:

clock generation means for generating an internal clock pulse signal obtained by dividing an external clock signal into at least halves, and outputting either a first internal clock pulse signal synchronized with a rising edge of the internal clock pulse signal, or a second internal clock pulse signal synchronized with a falling edge of the internal clock pulse signal, the external clock signal having a period changing according to operation speeds of the memory device; and a command pass unit for shifting an external command signal by a write latency signal, using the first or second internal clock pulse signal provided by the clock generation means, thereby outputting a write command signal for performing a write operation.

13. The command decoder circuit as claimed in claim 12, wherein the clock generation means comprises:

a clock division/buffer unit for generating and outputting the first divided internal clock pulse signal synchronized with a rising edge of the external clock signal, and the second divided internal clock pulse signal synchronized with a falling edge of the external clock signal; and a selector for selecting and outputting one of the first and the second internal clock pulse signal output from the clock division/buffer according to a write latency value.

14. The command decoder circuit as claimed in claim 13, wherein the clock division/buffer unit comprises:

a first division circuit for generating the first divided internal clock pulse signal synchronized with the rising edge of the external clock signal;

a second division circuit for generating the second divided internal clock pulse signal synchronized with the falling edge of the external clock signal; and an output circuit for outputting the first internal clock pulse signal generated by the first division circuit and the second internal clock pulse signal generated by the second division circuit.

15. The command decoder circuit as claimed in claim 14, wherein the first division circuit comprises a flip-flop which uses the external clock signal as a clock signal, and has an inversion output terminal connected to an input terminal, thereby dividing the external clock signal into halves to output the first internal clock pulse signal.

16. The command decoder circuit as claimed in claim 14, wherein the second division circuit inverts the first internal clock pulse signal of the first division circuit by using the external clock signal as a clock signal, thereby outputting the second internal clock pulse signal.

17. The command decoder circuit as claimed in claim 16, wherein the second division circuit includes a D flip-flop for receiving the external clock signal through a clock input terminal, receiving the first internal clock pulse signal through D-input terminal, and outputting the second internal clock pulse signal through /Q output terminal.

18. The command decoder circuit as claimed in claim 13, wherein the selector comprises:

a first selection circuit for determining whether to output the first internal clock pulse signal according to a write latency value; and a second selection circuit for determining whether to output the second internal clock pulse signal according to a write latency value.

19. The command decoder circuit as claimed in claim 18, wherein the second selection circuit outputs the second internal clock pulse signal when the write latency is an even number value, and the first selection circuit outputs the first internal clock pulse signal when the write latency is an odd number value.

* * * * *